(12) United States Patent
Ha et al.

(10) Patent No.: US 7,532,527 B2
(45) Date of Patent: May 12, 2009

(54) SEMICONDUCTOR MEMORY DEVICE

(75) Inventors: Sung-Joo Ha, Kyoungki-do (KR); Ho-Youb Cho, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 214 days.

(21) Appl. No.: 11/528,519

(22) Filed: Sep. 28, 2006

(65) Prior Publication Data
US 2007/0070670 A1 Mar. 29, 2007

(30) Foreign Application Priority Data
Sep. 28, 2005 (KR) ............... 10-2005-0090841
Apr. 26, 2006 (KR) ............... 10-2006-0037512

(51) Int. Cl.
G11C 7/00 (2006.01)

(52) U.S. Cl. ............... 365/203; 365/191; 365/200

(58) Field of Classification Search ......... 365/203, 365/191, 200
See application file for complete search history.

(56) References Cited

U.S. PATENT DOCUMENTS

| | | | |
|---|---|---|---|
| 6,052,756 A | 4/2000 | Barnaby et al. | |
| 6,181,619 B1 | 1/2001 | Bogin et al. | |
| 6,205,069 B1 * | 3/2001 | Kim ............... | 365/203 |
| 6,343,036 B1 | 1/2002 | Park et al. | |
| 6,401,180 B1 | 6/2002 | Hartmann | |
| 6,552,942 B2 | 4/2003 | Kim et al. | |
| 6,661,721 B2 * | 12/2003 | Lehmann et al. ............. | 365/203 |
| 6,788,599 B2 * | 9/2004 | Yoon .................... | 365/203 |
| 6,813,204 B2 | 11/2004 | Kim et al. | |
| 2004/0032776 A1 | 2/2004 | Kim et al. | |
| 2004/0221099 A1 * | 11/2004 | Kim ............... | 711/106 |
| 2006/0018168 A1 | 1/2006 | Kim | |

FOREIGN PATENT DOCUMENTS

| | | |
|---|---|---|
| JP | 2003-143240 | 5/2003 |
| JP | 2005-317124 | 11/2005 |
| KR | 1998-080431 | 11/1998 |
| KR | 1020010005094 A | 1/2001 |
| KR | 10-2005-0011456 | 1/2005 |
| TW | 440847 | 6/2001 |
| TW | 1236678 | 7/2005 |

OTHER PUBLICATIONS

Korean Office Action, issued in corresponding Korean Patent Application No. 9-5-2007-049563538 issued on Sep. 13, 2007.
Korean Office Action issued in corresponding Korean Patent Application No. KR 10-2006-0037512, filed on Apr. 25, 2007.
English Translation of Notification for the Opinion of Examination, Mar. 5, 2009.

* cited by examiner

Primary Examiner—Pho M. Luu
(74) Attorney, Agent, or Firm—Mannava & Kang, P.C.

(57) ABSTRACT

A semiconductor memory device includes a bank including a plurality of cell blocks; a first group of local input/output lines to transfer data stored on a first group of the cell blocks; a second group of local input/output lines to transfer data stored on a second group of the cell blocks; a first precharge unit precharging the first group of the local input/output lines; a second precharge unit precharging the second group of the local input/output lines; a precharge signal generator to precharge the first and second groups of the cell blocks and the second group of the cell blocks.

10 Claims, 2 Drawing Sheets

SEMICONDUCTOR MEMORY DEVICE

FIELD OF THE INVENTION

The present invention relates to a semiconductor memory device, and more particularly, to a precharge circuit for local input/output lines in a semiconductor memory device.

DESCRIPTION OF RELATED ARTS

Typically, a semiconductor memory device that has a stack bank structure includes a plurality of banks, each configured with a group of memory cell arrays, each of which includes memory cells. The banks are arranged in the direction of word lines, and the memory cell arrays are also arranged in the direction of word lines and connected to local input/output lines. The local input/output lines serve as data transmission lines by being connected to global input/output lines. The local input/output lines are prepared as many as the divided banks and connected with precharge circuits to precharge the individual local input/output lines.

FIG. 1 illustrates a block diagram depicting a portion of one bank, which is divided into several regions depending on an output mode of data of a semiconductor memory device. For instance, for double data rate (DDR) memory devices, one bank is divided into 4 regions (often called "quarter bank") since DDR memory devices performs a 4-bit prepatch operation. In the case of a 16-bit data output mode, 16 bits of data are outputted from one quarter bank.

In particular, FIG. 1 illustrates a block diagram of conventional local input/output line precharge units and a precharge control signal generator for the local input/output line precharge units in one quarter bank, which is divided into a plurality of cell blocks.

The local input/output line precharge units LIOPCG1 to LIOPCG8 are controlled by the precharge control signal generator 103. The local input/output line precharge units LIOPCG1 to LIOPCG8 are disposed on one side of upper and lower local input/output lines 101 and 102 connected with the cell blocks, each including a predetermined number of unit cells to satisfy a data output operation mode of the semiconductor memory device. The cell blocks are also divided into a group of upper cell blocks Up Half and a group of lower cell blocks Down Half.

The upper and lower cell blocks Up Half and Down Half are connected respectively to the upper and lower local input/output lines 101 and 102, which are data transmission lines. In one quarter bank, there are write drivers WTDRV1 to WTDRV8 and the local input/output line precharge units LIOPCG1 to LIOPCG8. The write drivers WTDRV1 to WTDRV8 transfer data to the upper and lower local input/output lines 101 and 102 from global input/output lines. The local input/output line precharge units LIOPCG1 to LIOPCG8 precharge the upper and lower local input/output lines 101 and 102.

The upper and lower cell blocks UP Half and Down Half are arranged symmetrically. The upper cell blocks UP Half are connected with the upper local input/output lines 101, and the lower cell blocks Down Half are connected with the lower local input/output lines 102. The write drivers WTDRV1 to WTDRV8 and the local input/output line precharge units LIOPCG1 to LIOPCG8 are individually connected with the respective upper and lower local input/output lines 101 and 102.

The cell blocks are grouped into a group of the upper cell blocks Up Half and a group of the lower cell blocks Down Half to effectively use the banks due to the data processing condition of the semiconductor memory device, and thus to reduce the current dissipation. The local input/output line precharge units LIOPCG1 to LIOPCG8 perform a precharge operation in response to a local input/output line reset signal LIORST.

For instance, in the case of a 4-bit or 8-bit data output operation mode, data are outputted through the upper local input/output lines 101 or the lower local input/output lines 102 that are connected with the 8 cell blocks. In the case of a 16-bit data output operation mode, data are outputted through the local input/output lines 101 and 102 connected with the 16 cell blocks. The reason for this behavior is that only the 8 cell blocks are used for the 4-bit and 8-bit data output modes and the 16 cell blocks are used for the 16-bit data output mode.

However, the local input/output line precharge units LIOPCG1 to LIOPCG8 usually do not have a control signal for the 4-bit or 8-bit data output operation mode. Thus, the local input/output line precharge units LIOPCG1 to LIOPCG8 precharge the upper local input/output lines 101 and the lower input/output lines 102 at the same time. That is, the upper and lower local input/output lines 101 and 102 connected with the 16 cell blocks are all precharged. As a result, when the 4-bit or 8-bit data output operation mode is performed, the upper and lower local input/output lines 101 and 102 connected with the 16 cell blocks are all precharged unnecessarily, thereby resulting in current dissipation.

In more detail, the local input/output line reset signal LIORST is used to control the local input/output line precharge units LIOPCG1 to LIOPCG8. However, when the local input/output line reset signal LIORST is supplied to the individual local input/output line precharge units LIOPCG1 to LIOPCG8, the local input/output line reset signal LIORST is not usually controlled by the 4-bit, 8-bit and 16-bit data output operation mode but simply by three inverters INV1, INV2 and INV3 of the precharge control signal generator 103. Accordingly, it is necessary to develop a device that can precharge separately the cell blocks according to the operation mode so as to reduce the current dissipation.

SUMMARY OF THE INVENTION

It is, therefore, an object of the present invention to provide a semiconductor memory device that can reduce unnecessary dissipation of current by selectively precharging local input/output lines coupled to corresponding block banks.

In accordance with an aspect of the present invention, there is provided a semiconductor memory device, including: a bank including a plurality of cell blocks; a first group of local input/output lines to transfer data stored on a first group of the cell blocks according to a first data output mode; a second group of local input/output lines to transfer data stored on a second group of the cell blocks according to the first data output mode and a second data output mode; a first precharge unit precharging the first group of the local input/output lines; a second precharge unit precharging the second group of the local input/output lines; a precharge signal generator to precharge the first and second groups of the cell blocks for the first data output mode and the second group of the cell blocks for the second data output mode.

In accordance with another aspect of the present invention, there is provided a semiconductor memory device, including: an upper memory block to output stored data according to a first data output mode; a lower memory block to output stored data according to the first data output mode and a second data output mode; a first precharge unit to precharge local input/output lines of the upper memory block; a second precharge unit to precharge local input/output lines of the lower memory block; and a precharge controller controlling the first and second precharge units according to the first data output mode or the second data output mode.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A semiconductor memory device in accordance with various embodiments of the present invention will be described in detail with reference to the accompanying drawings.

Figure 1:
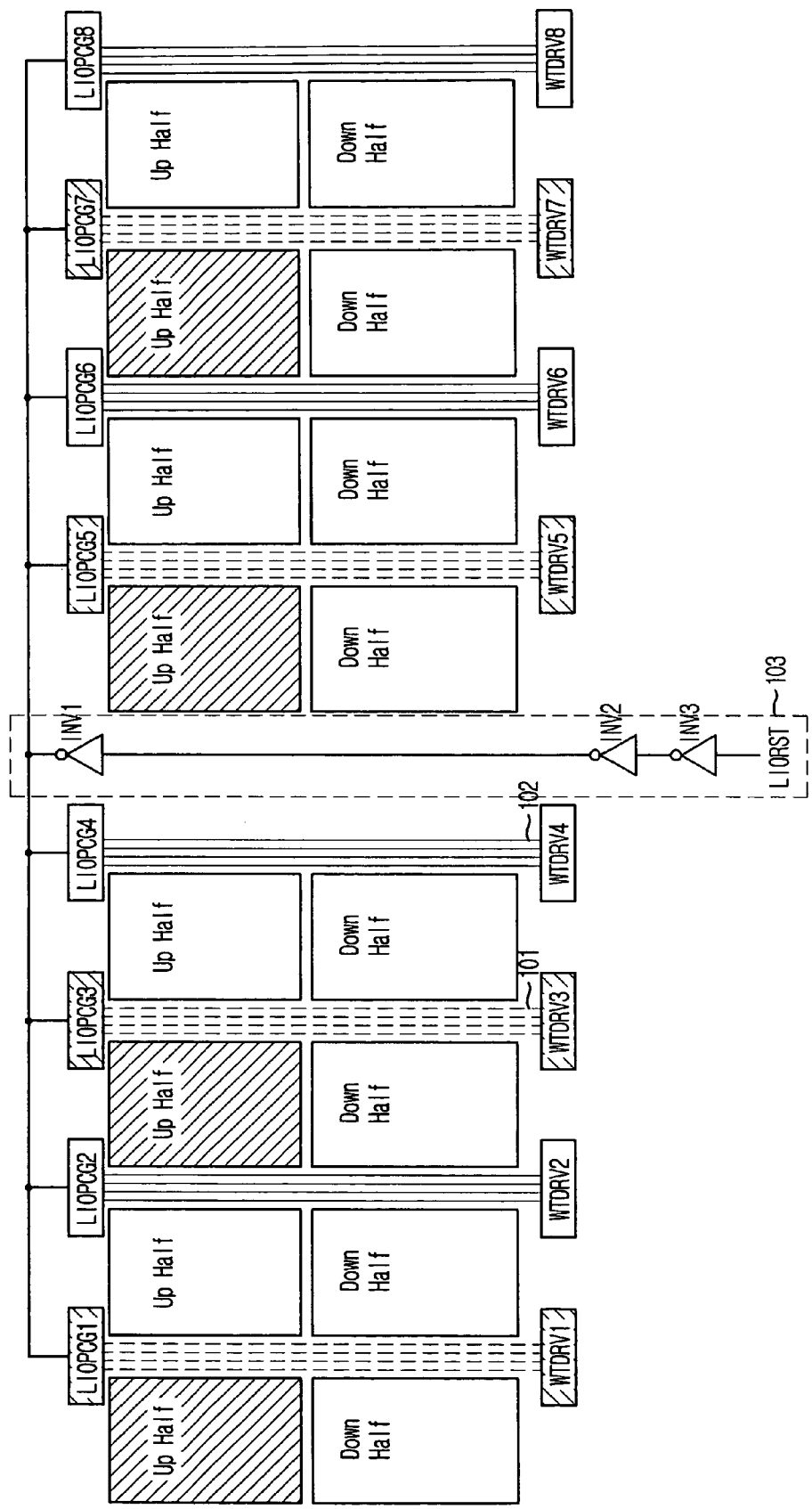
FIG. 1 illustrates a block diagram of conventional local input/output line precharge units and a precharge control signal generator for the conventional local input/output line precharge units.
Figure 2:
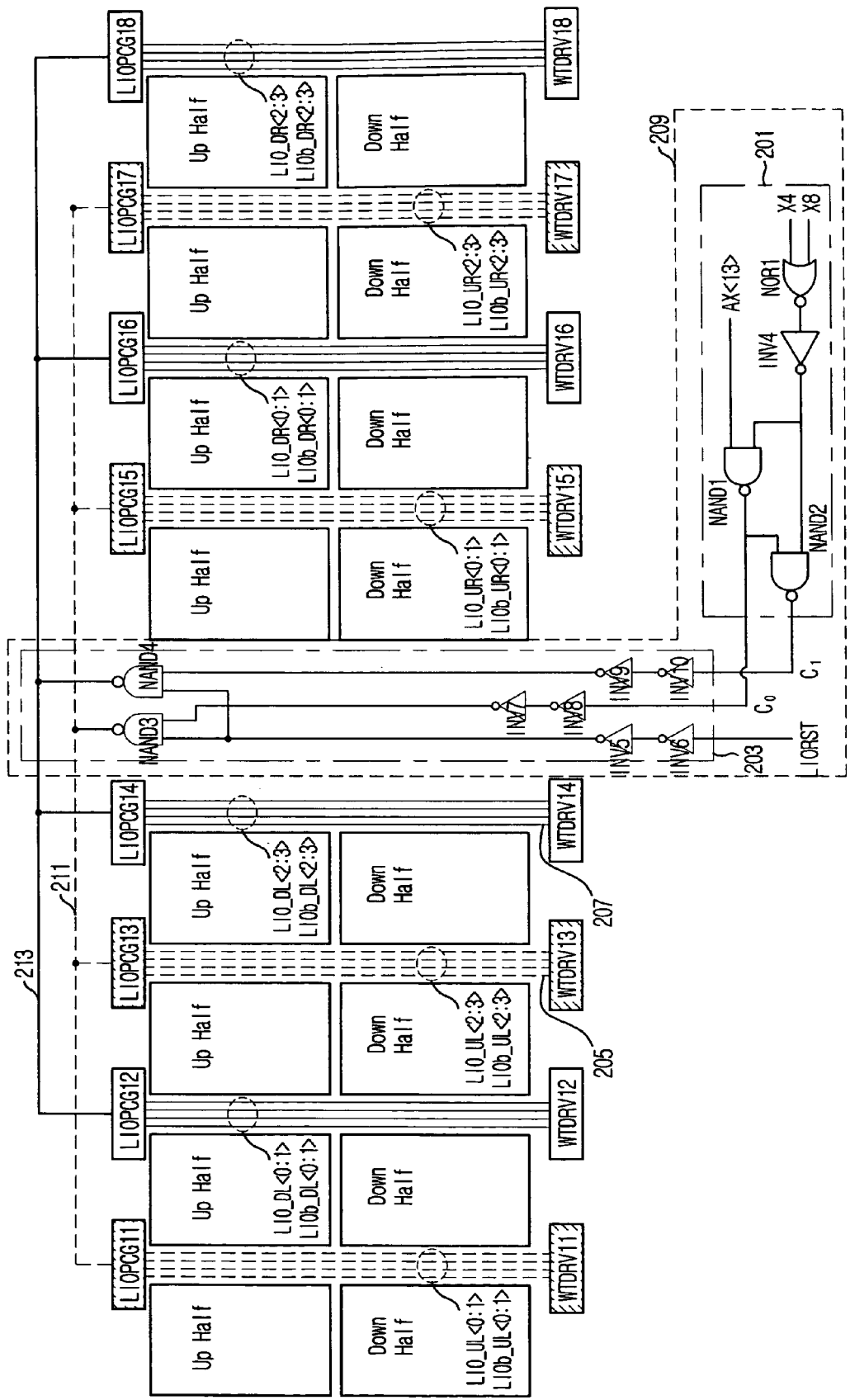
FIG. 2 illustrates a block diagram of local input/output line precharge units and a precharge control signal generator for the local input/output line precharge units in accordance with an embodiment of the present invention.

FIG. 2 illustrates a block diagram of local input/output line precharge units and a precharge control signal generator for the local input/output line precharge units in accordance with an embodiment of the present invention.

The local input/output line precharge units LIOPCG11 to LIOPCG18 are prepared on one side of upper and lower local input/output lines 205 and 207 coupled to cell blocks each including a predetermined number of unit cells to satisfy an intended data output operation mode of the semiconductor memory device. Also, the cell blocks are divided into a group of upper cell blocks UP Half and a group of lower cell blocks Down Half.

The upper and lower cell blocks Up Half and Down Half are arranged symmetrically. The upper cell blocks Up Half are coupled to the upper local input/output lines 205, while the lower cell blocks Down Half are coupled to the lower local input/output lines 207. Write driving units WTDRV11 to WTDRV18 and the local input/output line precharge units LIOPCG11 to LIOPCG18 are individually coupled to the respective upper and lower local input/output lines 205 and 206. The local input/output line precharge units LIOPCG11 to LIOPCG18 are grouped into an upper precharge unit group including those local input/output line precharge units LIOPCG11, LOPPCG13, LIOPCG15, and LIOPCG17, which are coupled to the upper local input/output lines 205, and a lower precharge unit group including those local input/output line precharge units LIOPCG12, LIOPCG14, LIOPCG16 and LIOPCG18, which are coupled to the lower local input/output lines 206. The precharge control signal generator 209 precharges the upper precharge unit group and the lower precharge unit group.

The precharge control signal generator 209 for the local input/output precharge units LIOPCG11 to LIOPCG18 includes a precharge selection signal generation unit 201 and a precharge signal generation unit 203. The precharge selection signal generation unit 201 generates first and second precharge selection signals $C_0$ and $C_1$ selecting the upper precharge unit group and the lower precharge unit group. The precharge signal generation unit 203 generates precharge signals in response to the first and second precharge selection signals $C_0$ and $C_1$ and a local input/output line reset signal LIORST, and transmits the precharge signals selectively to the upper precharge unit group and the lower precharge unit group through corresponding lines 211 and 213.

The precharge selection signal generation unit 201 includes an NOR gate NOR1, an inverter INV4, a first NAND gate NAND1, and a second NAND gate NAND2. The NOR gate NOR1 receives a signal x4 instructing a 4-bit data output operation mode and a signal x8 instructing an 8-bit data output operation mode. The inverter INV4 inverts an output signal of the NOR gate NOR1. The first NAND gate NAND1 receives an output signal of the inverter INV4 and an internal address signal AX<13> and outputs the first precharge selection signal $C_O$. The second NAND gate NAND2 receives the first precharge selection signal $C_O$ and the output signal of the inverter INV4 and outputs the second precharge selection signal $C_1$.

The precharge signal generation unit 203 may include a first group of inverters INV5 and INV6, a second group of inverters INV7 and INV8, a third group of inverters INV9 and INV10, a first NAND gate NAND3, and a second NAND gate NAND4. The first group of the inverters INV5 and INV6 inverts the local input/output line reset signal LIORST that resets the local input/output lines 205 and 207. The second group of the inverters INV7 and INV8 inverts the first precharge selection signal $C_O$. The third group of the inverters INV9 and INV10 inverts the second precharge selection signal $C_1$. The first NAND gate NAND3 receives output signals of the first and second groups of the inverters INV5 to INV8 and outputs a first precharge signal to the upper precharge group LIOPCG11, LIOPCG13, LIOPCG15, and LIOPCG17. The second NAND gate NAND4 receives output signals of the first and third groups of the inverters INV5, INV6, INV9 and INV10 and outputs a second precharge signal to the lower precharge group LIOPCG12, LIOPCG14, LIOPCG16, and LIOPCG18.

Table provided below briefly shows operations of the semiconductor memory device according to an embodiment of the present invention.

TABLE 1

| | AX<13> | $C_0$ | $C_1$ | Group operating precharge operation | (x4) mode signal | (x8) mode signal |
|---|---|---|---|---|---|---|
| (x16) operation mode | L | H | H | Upper and lower precharge group | L | L |
| | H | H | H | Upper and lower precharge group | | |
| (x8) operation mode | L | H | L | Upper precharge group | L | H |
| | H | L | H | Lower precharge group | | |
| (x4) Operation mode | L | H | L | Upper precharge group | H | L |
| | H | L | H | Lower precharge group | | |

In the 16-bit data output operation mode, the upper local input/output lines 205 and the lower local input/output lines 207 are precharged. In the 4-bit or 8-bit data output operation mode, the first and second precharge selection signals $C_0$ and $C_1$ are combined to selectively precharge the upper local input/output lines 205 and the lower local input/output lines 207.

According to exemplary embodiments of the present invention, precharge signals are generated to selectively precharge local input/output lines coupled to the corresponding cell blocks. Therefore, the selective precharge of the local input/output lines can reduce unnecessary current dissipation.

The present application contains subject matter related to the Korean patent application Nos. KR 2005-0090841 and 2006-0037512, filed in the Korean Patent Office respectively on Sep. 28, 2005, and on Apr. 26, 2006, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

For instance, the logic types and device layout described in the above embodiments are exemplary implementations when the input signals and output signals are activated to a logic high state. Thus, when the logic states of the signals are changed, the illustrated implementations are also changed. Thus, many other implementations are possible; however, these implementations will not be described in detail to prevent any potential abusive technical adaptation or modification by those skilled in the art.

Also, the precharge signal generation unit 203 and the precharge selection signal generation unit 201 are implemented in multiple logic circuits. However, it should be noted that this exemplary implementation is merely illustrative.

What is claimed is:

1. A semiconductor memory device comprising:
   a bank including a plurality of cell blocks;
   a first group of local input/output lines to transfer data stored on a first group of the cell blocks according to a first data output mode;
   a second group of local input/output lines to transfer data stored on a second group of the cell blocks according to the first data output mode and a second data output mode;
   a first precharge unit precharging the first group of the local input/output lines;
   a second precharge unit precharging the second group of the local input/output lines;
   a precharge signal generator to precharge the first and second groups of the cell blocks for the first data output mode and the second group of the cell blocks for the second data output mode,
   wherein the first data output mode is one of a 4-bit data operation mode and an 8-bit data operation mode and the second data output mode is a 16-bit data operation mode.

2. The semiconductor memory device of claim 1, wherein the precharge signal generator comprises:
   a precharge selection signal generation unit generating precharge selection signals in response to the operation mode and an internal address signal; and
   a precharge signal generation unit generating precharge signals in response to the respective precharge selection signals and a reset signal that resets the first and second groups of the local input/output lines.

3. The semiconductor memory device of claim 2, wherein the precharge selection signal generation unit comprises:
   a first NOR gate receiving a signal instructing a 4-bit data operation mode and a signal instructing an 8-bit data operation mode among various operation modes of the semiconductor memory devices;
   a first inverter inverting an output signal of the first NOR gate;
   a first NAND gate receiving an output signal of the first inverter and the internal address signal and generating a first precharge selection signal; and
   a second NAND gate receiving an output signal of the first NAND gate and the output signal of the first inverter and generating a second precharge selection signal.

4. The semiconductor memory device of claim 3, wherein the precharge signal generation unit comprises:
   a first group of inverters inverting the reset signal;
   a second group of inverters inverting the first precharge selection signal;
   a third group of inverters inverting the second precharge selection signal;
   a third NAND gate receiving output signals of the first and second groups of the inverters and generating a first precharge signal; and
   a fourth NAND gate receiving output signals of the first and third groups of the inverters and generating a second precharge signal.

5. A semiconductor memory device comprising:
   an upper memory block to output stored data according to a first data output mode;
   a lower memory block to output stored data according to the first data output mode and a second data output mode;
   a first precharge unit to precharge local input/output lines of the upper memory block;
   a second precharge unit to precharge local input/output lines of the lower memory block; and
   a precharge controller controlling the first and second precharge units according to the first data output mode or the second data output mode,
   wherein the first data output mode is one of a 4-bit data operation mode and an 8-bit data operation mode and the second data output mode is a 16-bit data operation mode.

6. The semiconductor memory device of claim 5, wherein the precharge controller activates the first precharge unit and inactivates the second precharge unit for the 4-bit data operation mode and the 8-bit data operation mode.

7. The semiconductor memory device of claim 6, wherein the precharge controller activates the first and second precharge units for the 16-bit data operation mode.

8. The semiconductor memory device of claim 7, wherein the precharge controller comprises:
   a precharge selection signal generation unit generating precharge selection signals in response to the operation mode and an internal address signal; and
   a precharge signal generation unit generating precharge signals in response to the respective precharge selection signals and a reset signal that resets the first and second groups of the local input/output lines.

9. The semiconductor memory device of claim 8, wherein the precharge selection signal generation unit comprises:
   a first NOR gate receiving a signal instructing a 4-bit data operation mode and a signal instructing an 8-bit data operation mode among various operation modes of the semiconductor memory devices;
   a first inverter inverting an output signal of the first NOR gate;

a first NAND gate receiving an output signal of the first inverter and the internal address signal and generating a first precharge selection signal; and a second NAND gate receiving an output signal of the first NAND gate and the output signal of the first inverter and generating a second precharge selection signal.

10. The semiconductor memory device of claim 9, wherein the precharge signal generation unit comprises:

a first buffer buffering the reset signal;

a second buffer buffering the first precharge selection signal;

a third buffer buffering the second precharge selection signal;

a third NAND gate receiving output signals of the first and second groups of the inverters and generating a first precharge signal; and a fourth NAND gate receiving output signals of the first and third groups of the inverters and generating a second precharge signal.

* * * * *